(12) United States Patent
Chiu et al.

(10) Patent No.: US 6,869,868 B2
(45) Date of Patent: Mar. 22, 2005

(54) METHOD OF FABRICATING A MOSFET DEVICE WITH METAL CONTAINING GATE STRUCTURES

(75) Inventors: Hsien-Kuang Chiu, Hsinchu (TW); Fang-Cheng Chen, Hsin-chu (TW); Haur-Ywh Chen, Kaohsiung (TW); Hun-Jan Tao, Hsinchu (TW); Yuan-Hung Chiu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/318,459

(22) Filed: Dec. 13, 2002

(65) Prior Publication Data

US 2004/0113171 A1 Jun. 17, 2004

(51) Int. Cl.⁷ .......................................... H01L 21/4763
(52) U.S. Cl. ...................... 438/592; 438/197; 438/585; 438/706
(58) Field of Search ................................. 438/592, 585, 438/197, 706

(56) References Cited

U.S. PATENT DOCUMENTS

| 5,625,217 A | 4/1997 | Chau et al. .................. 257/412 |
| 5,789,312 A | 8/1998 | Buchanan et al. .......... 438/585 |
| 6,100,188 A | 8/2000 | Lu et al. ...................... 438/653 |
| 6,326,251 B1 | 12/2001 | Gardner et al. ............. 438/197 |
| 6,429,109 B1 | 8/2002 | Zheng et al. |

*Primary Examiner*—Long Pham
(74) *Attorney, Agent, or Firm*—Haynes and Boone, LLP

(57) ABSTRACT

A method of forming a composite gate structure for a planar MOSFET device, as well as for vertical, double gate, FINFET device, has been developed. The method features a composite gate structure comprised of an overlying silicon gate structure shape, and an underlying titanium nitride gate structure shape. The titanium nitride component allows a lower work function, and thus lower device operating voltages to be realized when compared to counterpart gate structures formed with only polysilicon. A novel, two step gate structure definition procedure, featuring an anisotropic first etch procedure for definition of the polysilicon gate structure shape, followed by a wet or dry isotopic second etch procedure for definition of the titanium nitride gate structure shape, is employed.

32 Claims, 5 Drawing Sheets

METHOD OF FABRICATING A MOSFET DEVICE WITH METAL CONTAINING GATE STRUCTURES

BACKGROUND OF THE INVENTION

(1) Field of the Invention

The present invention relates to methods used to fabricate semiconductor devices, and more specifically to a method used to form a gate structure for a metal oxide semiconductor field effect transistor (MOSFET), or complimentary metal oxide semiconductor (CMOS), device.

(2) Description of Prior Art

Specific properties of polysilicon, such as the ability to withstand self-aligned metal silicide procedures, have resulted in the extensive use of polysilicon as a material for a gate structure for CMOS devices. However other characteristics of polysilicon can adversely influence the use of polysilicon gate structures for sub-100 um CMOS applications. For example the need to use low operating conditions for present CMOS applications demand devices featuring controllable, low threshold voltage. To establish low threshold voltages the work function of the gate structure should be lower than the work function obtained with a polysilicon gate structure. Doping of the polysilicon gate and of the underlying channel region in the semiconductor can not provide the needed reduced work function, therefore metal gate structures featuring lower work functions are attractive alternatives to polysilicon gate structures for sub-100 um CMOS devices. In addition a polysilicon depletion phenomena, in which the dopant in the polysilicon gate is depleted during subsequent fabrication procedures, also can result in inconsistent gate voltages across the underlying gate insulator layer, again suggesting the use of materials other than polysilicon for gate structures.

Although metal gate structures provide the desired work function and thus allow lower threshold voltages to be realized, several process shortcomings have to be addressed. First, metal gate structures are not compatible with the wet etch procedures used with self-aligned metal silicide applications. Exposure of the metal gate to the silicide procedure can result in degraded gate structures. Secondly the ion implantation masking ability, as well as the ability to withstand the anneal procedures experienced during self-aligned source/drain procedures, of metal gate structures are limited when compared to counterpart gate structures fabricated with polysilicon. Therefore a composite gate structure comprised with a polysilicon top portion needed for implant masking, and comprised with a metal bottom portion needed for work function or threshold voltage purposes, would be desirable.

The procedure needed to define a composite gate structure comprised of polysilicon-metal, is difficult to control in regards to terminating the etch procedure on the gate insulator layer, therefore protecting the underlying source/drain semiconductor material. This present invention will describe a novel procedure for fabrication of a metal containing gate structure, featuring a gate structure definition procedure allowing termination of the procedure at the appearance of the top surface of the underlying gate insulator layer. Prior art, such as Chau et al, in U.S. Pat. No. 5,625,217, Buchanan et al, in U.S. Pat. No. 5,789,312, Lu et al, in U.S. Pat. No. 6,100,188, and Gardner et al, in U.S. Pat. No. 6,326,251, describe methods of fabricating gate structures, but none of these prior art describe the novel gate definition procedure described in the present invention.

SUMMARY OF THE INVENTION

It is an object of this invention to fabricate a gate structure for a metal oxide semiconductor field effect transistor (MOSFET), or for a CMOS device.

It is another object of this invention to fabricate a gate structure comprised of an underlying, thin metal component and comprised of an overlying polysilicon component, to increase device performance and to reduce operating voltage when compared to counterpart gate structures comprised of only polysilicon.

It is still another object of this invention to define the metal containing gate structure (polysilicon-metal), via a dry etch procedure for definition of the polysilicon component, and via a selective wet or dry etch procedure for definition of the metal component of the metal containing gate structure.

It is still yet another object of this invention to define a metal containing gate structure for use in vertical, double gate, or fin type (FINFET), structures.

In accordance with the present invention of method of fabricating a composite gate structure, comprised of an overlying polysilicon component and an underlying metal, (titanium nitride), component, for use in conventional or FINFET, double gate CMOS structures, is described. A first iteration of this invention, referring to a planar device, features deposition of a thin titanium nitride layer on an underlying gate insulator layer, followed by the deposition of a polysilicon layer. Photolithographic and anisotropic dry etching procedures are employed to define the desired gate structure shape in polysilicon, followed by a selective wet or dry etch procedure used to define the desired gate structure shape in titanium nitride, with the selective etch terminating at the appearance of the top surface of the gate insulator layer. After formation of lightly doped source/drain regions in areas of the semiconductor substrate not covered by the composite gate structure, insulator spacers are formed on the sides of the gate structure. Heavily doped source/drain regions are then formed in areas of the semiconductor substrate not covered by the composite gate structure or by the insulator spacers, followed by the formation of metal silicide on the top surface of the polysilicon component of the composite gate structure, as well as on the heavily doped source/drain regions.

A second iteration of this invention, referring to a vertical, or FINFET device, entails definition of a vertical silicon shape from a silicon on oxide layer, followed by the growth of a gate insulator layer on the surface of the vertical silicon shape. Deposition of an underlying titanium nitride layer is followed by deposition of an overlying polysilicon layer. Definition of a composite gate structure, comprised of an overlying polysilicon component and a thin, underlying titanium nitride component is again accomplished via photolithographic and anisotropic dry etching procedures for polysilicon, while either selective wet or dry procedures are used for etching of titanium nitride. The composite gate structure is defined in a direction normal to the direction of the vertical silicon shape. After definition of insulator spacers on the composite gate structure, source/drain regions are formed in areas of the vertical silicon shape not covered by the composite gate structure of by the insulator spacers. Metal silicide is again formed on the top surface of the composite gate structure as well as on source/drain regions.

BRIEF DESCRIPTION OF THE DRAWINGS

The object and other advantages of this invention are best described in the preferred embodiment, with reference to the attached drawings that include.

DESCRIPTION OF THE PREFERRED EMBODIMENTS

Figure 1:
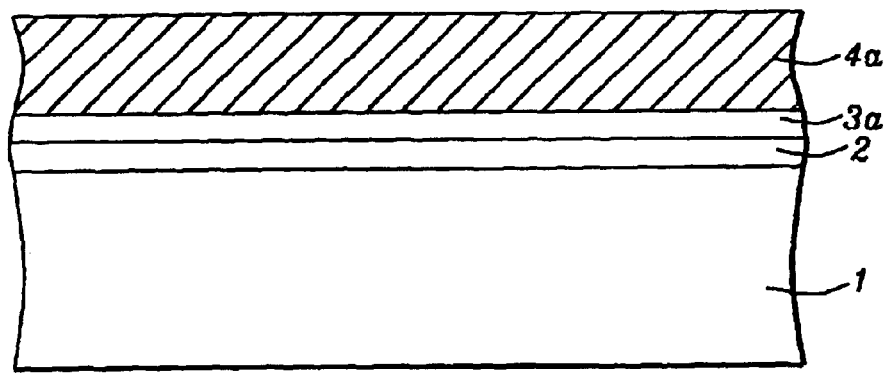
FIGS. 1–4, which schematically in cross-sectional style describe a first embodiment of this invention, in which a composite gate structure, comprised of an overlying polysilicon component and an underlying, thin titanium nitride component, is formed on a gate insulator layer for use in planar type, MOSFET or CMOS devices.

The method of forming a composite gate structure comprised of an overlying polysilicon component and a thin, underlying titanium nitride component, for use as gate structures for conventional planar type MOSFET or CMOS devices, as well as for fin type field effect transistor (FINFET), or a vertical double gate devices, will now be described in detail. A first iteration of this invention entails the use of P type, semiconductor substrate 1, comprised of single crystalline silicon featuring a <100> crystallographic orientation. Gate insulator layer 2, comprised of silicon dioxide is next thermally grown to a thickness between about 8 to 40 Angstroms. If desired high dielectric constant layers, such as $HfO_2$, $ZrO_2$, and SiN, can be used as gate insulator layers. Conductive layer 3a, needed for the underlying component of a composite gate structure, is next deposited via physical vapor deposition procedures to a thickness between about 10 to 300 Angstroms. A conductive layer with a specific Fermi level is chosen to allow a subsequent composite gate structure, featuring the conductive layer as an underlying component, to contribute to a desired low threshold voltage. Therefore a conductive layer such as titanium nitride is used, allowing the work function difference between the underlying channel region and the titanium nitride gate structure component to be minimized. If desired other conductive layers such as tantalum nitride, tungsten nitride, and titanium—tungsten, can be used to supply the desired work function needed for attainment of low threshold voltages. In addition to the attainment of low threshold voltages the presence of conductive layer component will decrease the risk of dopant being removed from an overlying polysilicon component of the composite gate structure, with the reduction in polysilicon depletion allowing the desired device performance to be realized. Polysilicon layer 4b, is next deposited via low pressure chemical vapor deposition (LPCVD), procedures, to a thickness between about 500 to 2000 Angstroms. Polysilicon layer 4a, can be doped in situ during deposition via the addition of arsine, or phosphine to a silane or disilane ambient, or polysilicon layer 5a, can be deposited intrinsically then doped via implantation of arsenic or phosphorous ions. If desired an amorphous silicon layer can be used in place of polysilicon. The result of the above procedures is schematically shown in FIG. 1.

Figure 2:
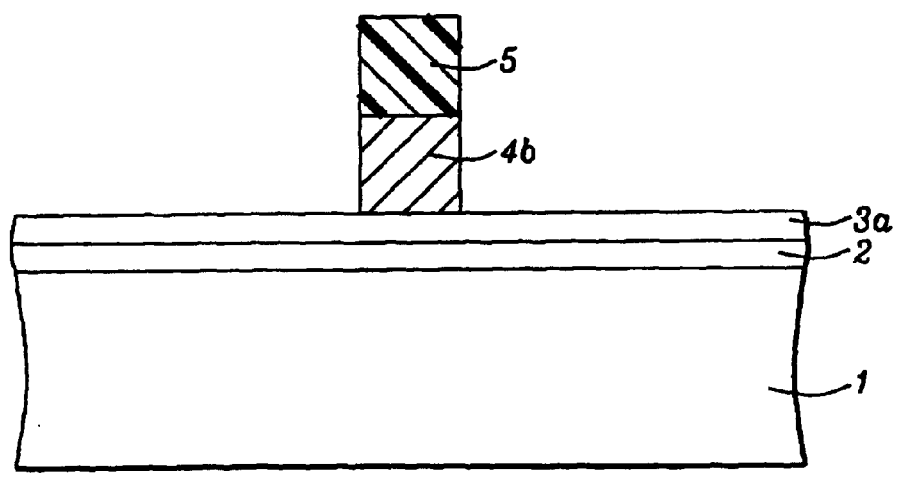
Figure 3:
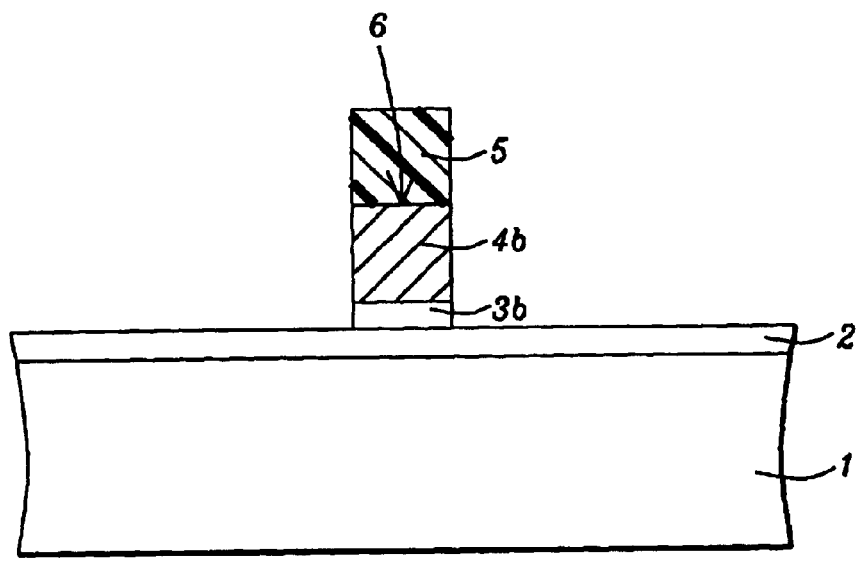

The definition of a composite gate structure comprised of an overlying polysilicon component and an underlying conductive, or titanium nitride component, is next addressed and schematically illustrated using FIGS. 2–3. Photoresist shape 5, is defined and used as an etch mask to allow an anisotropic reactive ion etch (RIE), procedure to define polysilicon gate structure component 4b. This is schematically shown in FIG. 2. The anisotropic RIE procedure is performed using a combination of $Cl_2$. HBr, and $O_2$, as an etchant for polysilicon with the procedure terminating at the appearance of the top surface of conductive layer 3. It would be difficult to attempt to use a single etch procedure to define the entire composite gate structure without breaking through the gate insulator layer and attacking exposed regions of the semiconductor substrate, therefore a two step definition procedure is employed. The width of polysilicon gate structure component 4b, which will determine the subsequent device channel length, is between about 0.02 to 0.25 um.

With photoresist shape 5, still in place, definition of underlying, titanium nitride gate structure component 3b, is performed. This is accomplished using an etch chemistry selective to silicon dioxide, so at the conclusion of definition of titanium nitride gate structure component 3b, the etchants used will not attack or etch exposed regions of silicon dioxide layer 2. A dry etch, or RIE procedure, using HBr—$Cl_2$He—$O_2$ as a selective etchant for titanium nitride can be used for this definition procedure. To insure complete removal of exposed titanium nitride an isotropic component may be added to etch procedure. A second alternative for selective etching of titanium nitride, which is inherently isotropic, is a wet etch procedure. The wet etch procedure is performed using an amine base solution, a solution comprised with hydroxylamine If the wet etch alternative is used photoresist shape 5, may be removed prior to the wet etch procedure allowing the defined polysilicon gate structure component 4b, to perform as an etch mask. Composite gate structure 6, comprised of polysilicon gate structure component 4b, and titanium nitride gate structure component 3b, is schematically shown in FIG. 3.

Figure 4:
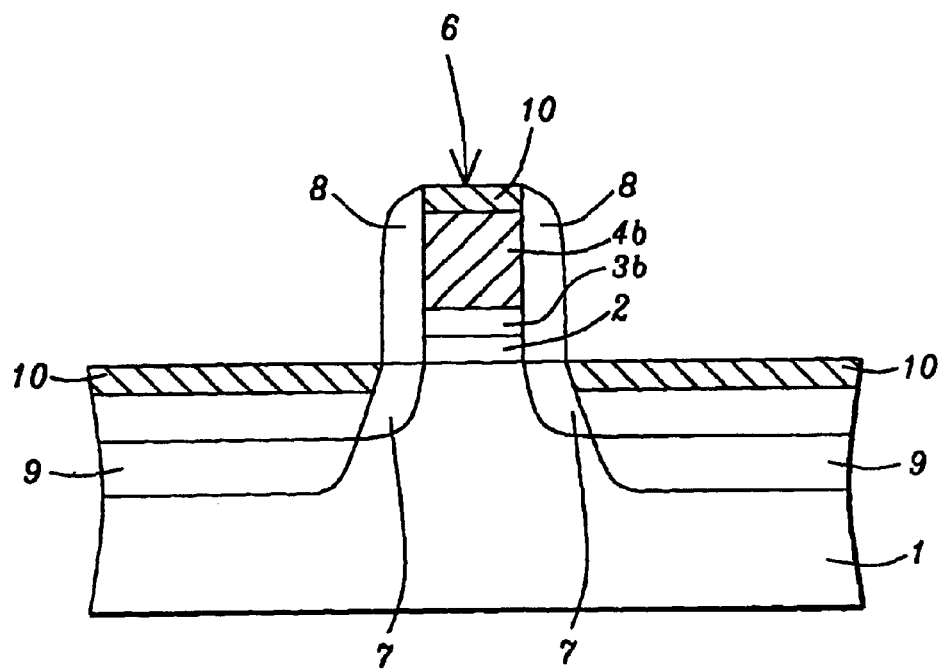

The fabrication of a planar type MOSFET or CMOS device, featuring the composite gate structure in turn defined via a two step definition procedure, is next addressed and schematically illustrated using FIG. 4. Photoresist shape 5, is removed via plasma oxygen ashing procedures followed by wet clean procedures, with an buffered hydrofluoric acid component of the wet clean procedure selectively removing exposed portions of silicon dioxide gate insulator layer. Lightly doped source/drain region 7, either N type for N channel devices, or P type for P channel devices, are formed via ion implantation into regions of semiconductor substrate 1, not covered by composite gate structure 6. Insulator spacers 8, comprised of either silicon oxide or silicon nitride are next formed on the sides of composite gate structure 6, via deposition of the insulator layer followed by an anisotropic RIE procedure. Heavily doped source/drain region 9, again either N type for N channel devices, or P type for P channel devices, are then formed via ion implantation into regions of semiconductor substrate 1, not covered by composite gate structure 6, or by insulator spacers 8. Metal silicide layer 10, is then selectively formed on the top surface of composite gate structure 6, and on heavily doped source/drain region 9. This is accomplished via deposition of a metal layer such titanium, followed by an anneal procedure used to convert titanium to titanium silicide on regions in which titanium overlaid conductive regions, while other portions of titanium overlaying insulator areas remain unreacted. A wet etch procedure is then used to remove the unreacted portions of titanium. It should be noted that if a gate structure were comprised only of a conductive material, the selective removal of unreacted metal, post silicide formation, could damage the top portion of the conductive gate structure.

Figure 5A:
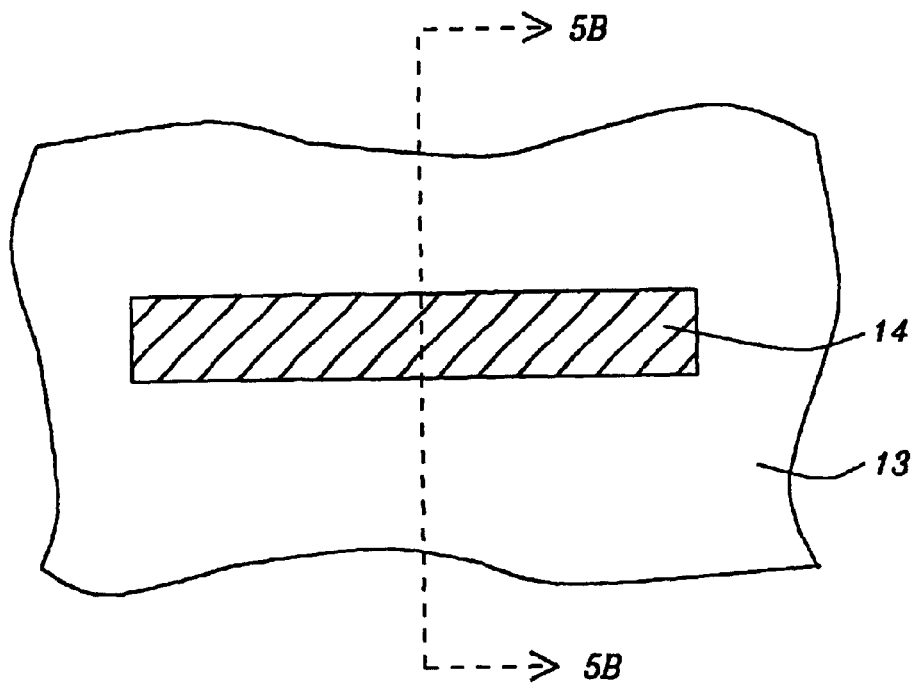
FIGS. 5A, 5B, 6, 7A, and 7B, which schematically in cross-sectional, and schematically in top view format, describe a second embodiment of this invention, in which a composite gate structure, comprised of an overlying polysilicon component and an underlying, thin titanium nitride component, is formed on a vertical silicon shape of a FINFET or vertical, double gate device.
Figure 5B:
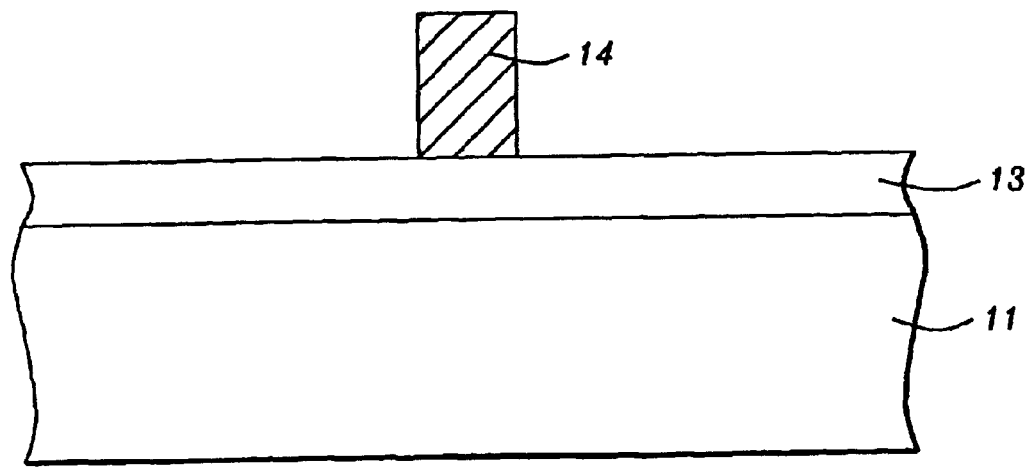

A second iteration of this invention featuring definition of a composite gate structure, again comprised of a polysilicon component and an underlying titanium nitride component, formed via the use of the two step definition procedure, and applied to a FINFET, or vertical, double gate structure, will next be described. A silicon on insulator (SOI), layer, comprised of insulator layer 13, such as a silicon dioxide layer, and overlying silicon layer 14, is formed on semiconductor substrate 11. The thickness of the silicon layer 14, is between about 300 to 1200 Angstroms. Photolithographic and dry etching procedures are used to define silicon shape 14, shown schematically in cross-sectional style in FIG. 5B, and schematically shown as a top view in FIG. 5A. Silicon shape 14, with a vertical height equal to the thickness of the silicon layer, will subsequently be used to accommodate the source/drain and channel regions of a vertical, double gate structure.

Figure 6:
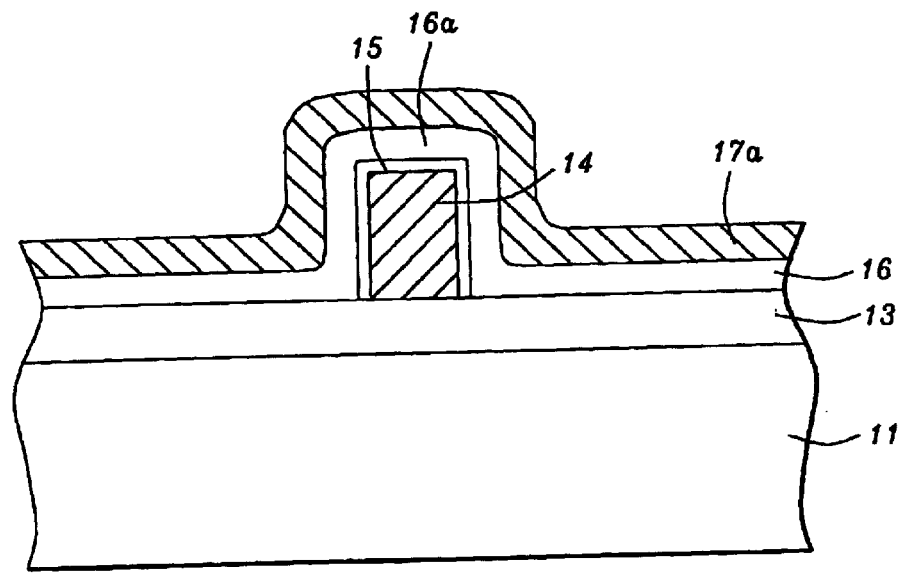

Silicon dioxide gate insulator layer 15, is next formed at a thickness between about 8 to 40 Angstroms, on all exposed surfaces of silicon shape 14. Conductive layer 16a, again a layer such as titanium nitride, is deposited via PVD procedures to a thickness between about 10 to 300 Angstroms. The conductive layer, to be the interfacing gate structure component to the underlying gate insulator layer, will provide the desired low work function thus allowing lower operating conditions for the FINFET device to be used. If desired other conductive layers such as tantalum nitride, tungsten nitride, and titanium—tungsten, can be used to supply the desired work function needed for attainment of low threshold voltages. Polysilicon layer 17a, is next deposited is deposited via low pressure chemical vapor deposition (LPCVD), procedures, to a thickness between about 500 to 2000 Angstroms. Polysilicon layer 17a, can be doped in situ during deposition via the addition of arsine, or phosphine to a silane or disilane ambient, or polysilicon layer 17a, can be deposited intrinsically then doped via implantation of arsenic or phosphorous ions. If desired an amorphous silicon layer can be used in place of polysilicon. The result of these growth and deposition procedures is schematically shown in FIG. 6.

Figure 7A:
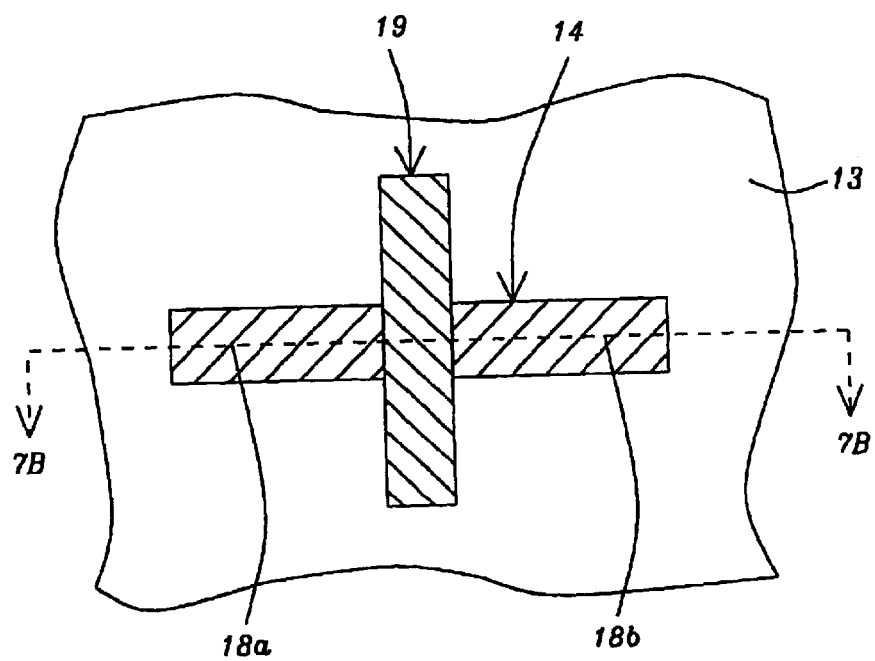
Figure 7B:
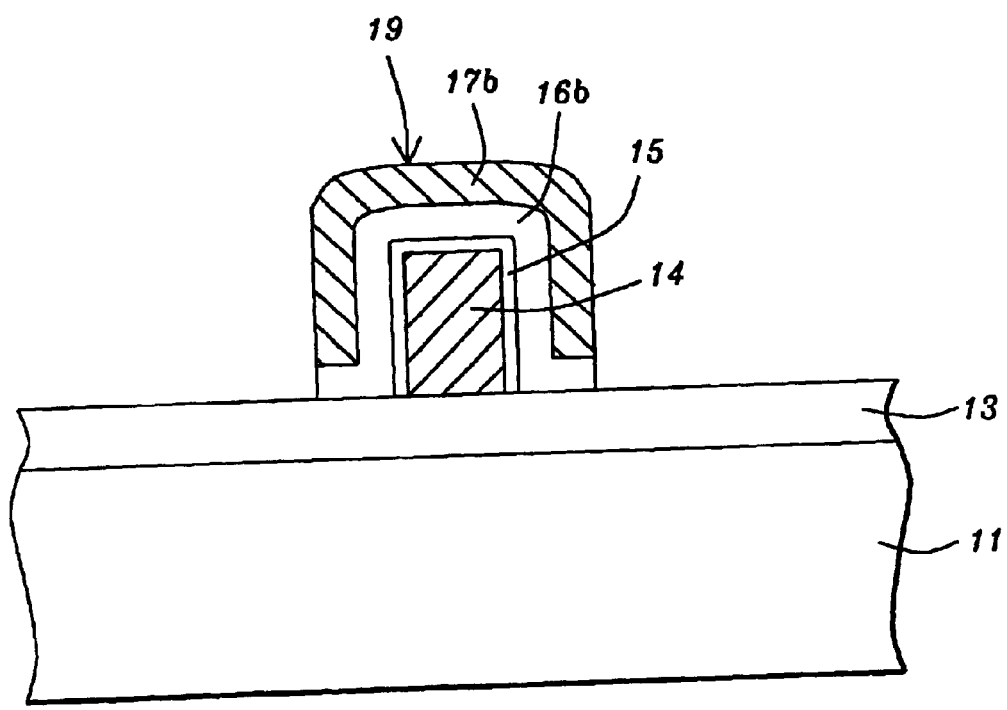

The identical two step definition procedure described for the first iteration of the invention, is again used to define composite gate structure 19, comprised of polysilicon component 17b, and underlying titanium nitride component 16b. A photoresist shape, not shown in the drawings, is used as an etch mask to allow a RIE procedure to define polysilicon gate structure component 17b. The RIE procedure is performed using a combination of $Cl_2$, HBr, and $O_2$, as an etchant for polysilicon with the procedure terminating at the appearance of titanium nitride layer 16a. The RIE procedure is performed at conditions allowing a degree of isotropic etching to occur to enable removal of the portions of polysilicon located on the sides of silicon shape 14. After removal of the photoresist shape, used for definition of polysilicon gate structure component 17b, a wet etch procedure is used to selectively remove exposed portions of titanium nitride layer 16a, resulting in the definition of titanium nitride gate structure component 16b. This is schematically shown in cross-sectional style in FIG. 7B, and schematically as a top view in FIG. 7A. The wet etch procedure again is performed using an amine base solution, a solution such as hydroxylamine. The width of composite gate structure 19, which will determine the subsequent device channel length, is between about 0.02 to 0.25 um.

Subsequent processing needed to complete the fabrication procedure for the vertical, double gate structure includes: formation of lightly doped source/drain regions in portions of silicon shape 14, not covered by composite gate structure 19; formation of insulator spacers on the sides of composite gate structure 19; formation of heavily doped source/drain regions in portions of silicon shape 14, not covered by composite gate structure 19, or by the insulator spacers; and selective formation of metal silicide on the top surface of composite gate structure 19, and on the exposed surfaces of the heavily doped source/drain regions.

While this invention has been particularly shown and described with reference to, the preferred embodiments thereof, it will be understood by those skilled in the art that various changes in form and details may be made without departing from the spirit and scope of this invention.

What is claimed is:

1. A method of forming a metal oxide semiconductor field effect transistor (MOSFET), on a semiconductor substrate featuring a composite gate structure, comprising the steps of:

forming a gate insulator layer on said semiconductor substrate;

depositing a conductive layer material;

depositing a silicon layer; and performing a two step etch procedure to define said composite gate structure on said gate insulator layer, featuring a first etch procedure defining a silicon component of said composite gate structure and featuring a second etch procedure defining a conductive layer component for said composite gate structure.

2. The method of claim 1, wherein said gate insulator layer is a silicon dioxide layer, obtained via thermal oxidation procedures at a thickness between about 8 to 40 Angstroms.

3. The method of claim 1, wherein said gate insulator layer is a high dielectric constant (high k), dielectric, such as an oxide containing Hf, Zr, or Al, obtained via chemical vapor deposition or atomic layer deposition, to a thickness between about 10 to 60 Angstroms.

4. The method of claim 1, wherein said conductive layer is a titanium nitride layer, obtained via physical vapor deposition (PVD), procedures, at a thickness between about 10 to 300 Angstroms.

5. The method of claim 1, wherein said conductive layer is chosen from a group that contains tantalum nitride, tungsten nitride, and titanium—tungsten.

6. The method of claim 1, wherein said silicon layer is a polysilicon layer, obtained via low pressure chemical vapor deposition (LPCVD), procedures, at a thickness between about 500 to 2000 Angstroms.

7. The method of claim 1, wherein said first etch procedure used to define said silicon component of said composite gate structure is performed via an anisotropic reactive ion etch (RIE), procedure, using a combination of $Cl_2$, HBr, and $O_2$, as an etchant.

8. The method of claim 1, wherein said second etch procedure used to define said conductive layer component of said composite gate structure, is performed via wet etch procedures, using an amine base solution, or a hydroxylamine contained solution.

9. The method of claim 1, wherein said second etch procedure used to define said conductive layer component of said composite gate structure, is an isotropic dry etch procedure, using HBr—$Cl_2$—He—$O_2$ as an etchant, or a combination such as $Cl_2$—$O_2$, HBr—$Cl_2$—$O_2$, or HBr—He—$Cl_2$—$O_2$.

10. The method of claim 1, wherein the line width of said composite gate structure is between about 0.02 to 0.25 um.

11. A method of forming a composite gate structure for a MOSFET device on a semiconductor substrate, wherein the composite gate structure is comprised of an overlying polysilicon component and of an underlying titanium nitride component, defined via use of a two step definition procedure, comprising the steps of:
- forming a gate insulator layer on said semiconductor substrate;
- depositing a titanium nitride layer;
- depositing a polysilicon layer;
- performing an anisotropic first etch procedure of said two step definition procedure to define said polysilicon component for said composite gate structure; and
- performing an isotropic second etch procedure of said two step definition procedure to define said titanium nitride component of said composite gate structure.

12. The method of claim 1, wherein said gate insulator layer is a silicon dioxide layer, thermally grown to a thickness between about 8 to 40 Angstroms.

13. The method of claim 11, wherein said gate insulator layer is a high dielectric constant (high k), dielectric, such as an oxide containing Hf, Zr, or Al, obtained via chemical vapor deposition or atomic layer deposition, to a thickness between about 10 to 60 Angstroms.

14. The method of claim 11, wherein said titanium nitride layer is obtained via PVD procedures to a thickness between about 10 to 300 Angstroms.

15. The method of claim 11, wherein said polysilicon layer is obtained via LPCVD procedures to a thickness between about 500 to 2000 Angstroms.

16. The method of claim 11, wherein said anisotropic first etch procedure used to define said polysilicon component of said composite gate structure, is performed via an anisotropic reactive ion etch (RIE), procedure, using a combination of $Cl_2$, HBr, and $O_2$, as an etchant.

17. The method of claim 11, wherein said isotropic second etch procedure used to define said titanium nitride component of said composite gate structure, is performed via wet etch procedures using an amine base solution, or a hydroxylamine as an etchant.

18. The method of claim 11, wherein said isotropic second etch procedure, used to define said titanium nitride component of said composite gate structure, is an isotropic dry etch procedure, using HBr—$Cl_2$—He—$O_2$, as an etchant, or a combination such as $Cl_2$—$O_2$ HBr—$Cl_2$—$O_2$, or HBr—He—$Cl_2$—$O_2$.

19. The method of claim 11, wherein the width of said composite gate structure is between about 0.02 to 0.25 um.

20. A method of forming a composite gate structure for a fin type (FINFET), vertical, double gate device, on an insulator layer, wherein the composite gate structure is comprised of an overlying polysilicon component and of an underlying titanium nitride component, defined featuring a two step definition procedure, comprising the steps of:
- forming a silicon on insulator (SOI), on a semiconductor substrate;
- defining a silicon shape from said SOI layer;
- growing a gate insulator layer on said silicon shape;
- depositing a titanium nitride layer;
- depositing a polysilicon layer; and
- performing said two step definition procedure to define said composite gate structure on said silicon dioxide gate insulator layer, with said composite gate structure comprised of said overlying polysilicon component and of said underling titanium nitride component, and wherein said composite gate structure is defined normal in direction to said silicon shape.

21. The method of claim 20, wherein the thickness of silicon of said SOI layer is between about 300 to 1200 Angstroms.

22. The method of claim 20, wherein said gate insulator layer is a silicon oxide layer, thermally grown to a thickness between about 8 to 40 Angstroms.

23. The method of claim 20, wherein said gate insulator layer is a high dielectric constant (high k), dielectric, such as an oxide containing Hf, Zr, or Al, obtained via chemical vapor deposition or atomic layer deposition, to a thickness between about 10 to 60 Angstroms.

24. The method of claim 20, wherein said titanium nitride layer is obtained via PVD procedures to a thickness between about 10 to 300 Angstroms.

25. The method of claim 20, wherein said polysilicon layer is obtained via LPCVD procedures to a thickness between about 500 to 2000 Angstroms.

26. The method of claim 20, wherein a first etch procedure of said two step definition procedure, used to define said polysilicon component of said composite gate structure, is performed via RIE procedure, using a combination of $Cl_2$, HBr, and $O_2$, as an etchant.

27. The method of claim 20, wherein a second etch procedure of said two step definition procedure, used to define said titanium nitride component of said composite gate structure, is performed via a wet etch procedure, using an amine base solution, or a hydroxylamine contained solution.

28. A fin type field effect transistor (FINFET), vertical double gate device, comprising:
- an insulator layer on a semiconductor substrate;
- a vertical silicon shape on said insulator layer;
- a gate insulator layer on surfaces of said vertical silicon shape;
- a composite gate structure comprised of an overlying silicon shape on an underlying titanium nitride shape, on said gate insulator layer, with said composite gate structure located parallel in direction to direction of said vertical silicon shape;
- insulator spacers on the sides of said composite gate structure;
- source/drain regions in portions of said vertical silicon shape not covered by said composite gate structure or by said insulator spacers; and
- metal silicide on top surface of said composite gate structure and on said source/drain region.

29. The vertical, double gate, or FINFET device of claim 28, wherein the height of said vertical silicon shape is between about 300 to 1200 Angstroms.

30. The vertical, double gate, or FINFET device of claim 28, wherein said gate insulator layer is comprised of silicon dioxide, at a thickness between about 10 to 100 Angstroms, or a high dielectric constant (high k), layer, such as an oxide containing Hf, Zr, or Al, at a thickness between about 10 to 60 Angstroms.

31. The vertical, double gate, or FINFET device of claim 28, wherein said underlying titanium nitride shape of said composite gate structure is between about 10 to 300 Angstroms.

32. The vertical double gate, or FINFET device of claim 28, wherein said overlying polysilicon shape of said composite gate structure is between about 500 to 2000 Angstroms.

* * * * *